(12) United States Patent
Xu

(10) Patent No.: US 7,639,512 B1
(45) Date of Patent: Dec. 29, 2009

(54) BACK PLATE ASSEMBLY

(75) Inventor: Hong-Bo Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/211,045

(22) Filed: Sep. 15, 2008

(30) Foreign Application Priority Data

Jul. 8, 2008 (CN) ........................ 200810302647.4

(51) Int. Cl.
*H05K 7/14* (2006.01)

(52) U.S. Cl. ........................ 361/807; 361/767; 361/808; 361/809

(58) Field of Classification Search ................. 361/809, 361/808, 767, 810, 807; 174/520, 535
See application file for complete search history.

(56) References Cited

U.S. PATENT DOCUMENTS 5,424,918 A * 6/1995 Felps et al. ................. 361/704
5,684,467 A * 11/1997 Hur ........................... 340/693.9
6,741,477 B2 * 5/2004 Sivertsen ..................... 361/752
6,771,516 B1 * 8/2004 Leman et al. ................ 361/825
7,072,176 B2 * 7/2006 Lin et al. ................ 361/679.02
7,184,277 B2 * 2/2007 Beirne .......................... 361/807
7,339,549 B2 * 3/2008 Maxwell ....................... 343/892

* cited by examiner

*Primary Examiner*—Dameon E Levi
(74) *Attorney, Agent, or Firm*—Frank R. Niranjan

(57) ABSTRACT

A back plate assembly is compatible with mainboards having different specification. The back plate assembly includes a back plate and a plurality of fasteners engaging with the back plate. The back plate defines a plurality of sets of mounting holes. Each set of mounting holes is used to align with through holes in mainboard with a corresponding specification. The mounting holes are spaced from each other and each includes a first receiving hole and a second receiving hole located at a lower portion of the first receiving hole. The fasteners are interferentially fitted in a corresponding set of the mounting holes of the back plate. Each fastener includes a baffling portion received in the first receiving hole of the mounting hole, and a connecting portion extending downwardly from the baffling portion of the fastener and received in the second receiving hole of the mounting hole.

9 Claims, 5 Drawing Sheets

BACK PLATE ASSEMBLY

BACKGROUND OF THE INVENTION

1. Field of the Invention

The present invention relates to a back plate assembly, and more particularly to a back plate assembly compatible with different specifications of mainboards.

2. Description of Related Art

A computer usually has a computer chassis that may hold a mainboard, a power supply and multiple printed circuit board (PCBs) such as graphic, sound cards and network cards.

There are three specifications for mainboards: one is 775 specification, one is AM2 specification, and another is K8 specification. The mainboard mounted on the computer chassis usually has electric capacitors, slots for random access memory (RAM), and a socket for a central processing unit (CPU) mounted on the mainboard. The CPU often generates large amounts of heat during operation, which can destabilize the electronic components and cause damage to the electronic components. Typically, therefore, a heat sink assembly including a heat sink and a back plate is mounted on the CPU to remove heat therefrom.

However, the back plate of the heat sink assembly can not be compatible with the mainboards with different specifications, which means that different back plates having different configurations are required for fastening the heat sinks to the CPUs mounted on 775 mainboard, AM2 mainboard, and K8 mainboard. For manufacturing and managing such different back plates, cost is high.

What is needed, therefore, is a back plate assembly which is compatible with mainboards with different specifications.

SUMMARY OF THE INVENTION

A back plate assembly is compatible with mainboards with different specification. The back plate assembly includes a back plate and a plurality of fasteners engaging with the back plate. The back plate defines a plurality of sets of mounting holes. Each set of mounting holes is aligned with through holes in a corresponding mainboard with a specific specification. The mounting holes each includes a first receiving hole and a second receiving hole located at a lower portion of the first receiving hole. The fasteners are interferentially fitted in the mounting holes of the back plate. Each fastener includes a baffling portion received in the first receiving hole of the mounting hole, and a connecting portion extending downwardly from the baffling portion of the fastener and received in the second receiving hole of the mounting hole. The fasteners are fitted in a specific set of mounting holes for a corresponding mainboard with a specific specification.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
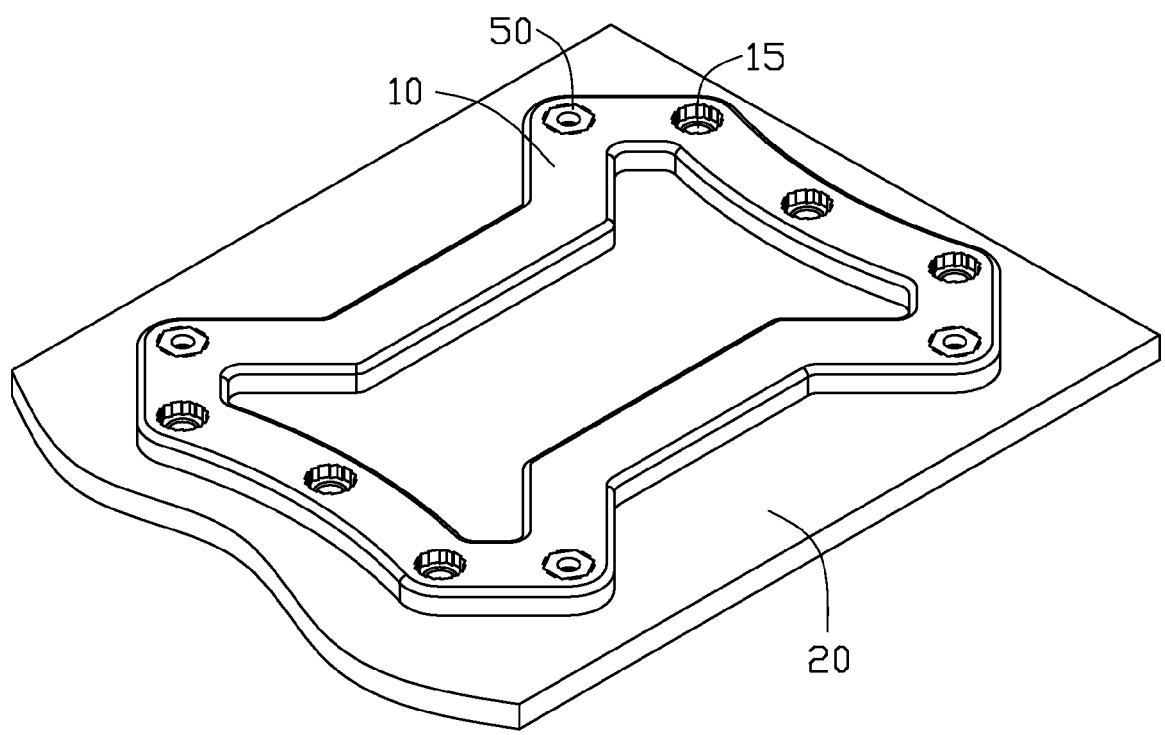
FIG. 1 is an assembled view of a back plate assembly in accordance with a preferred embodiment of the present invention, wherein the back plate assembly is mounted to a mainboard with a first specification.
Figure 2:
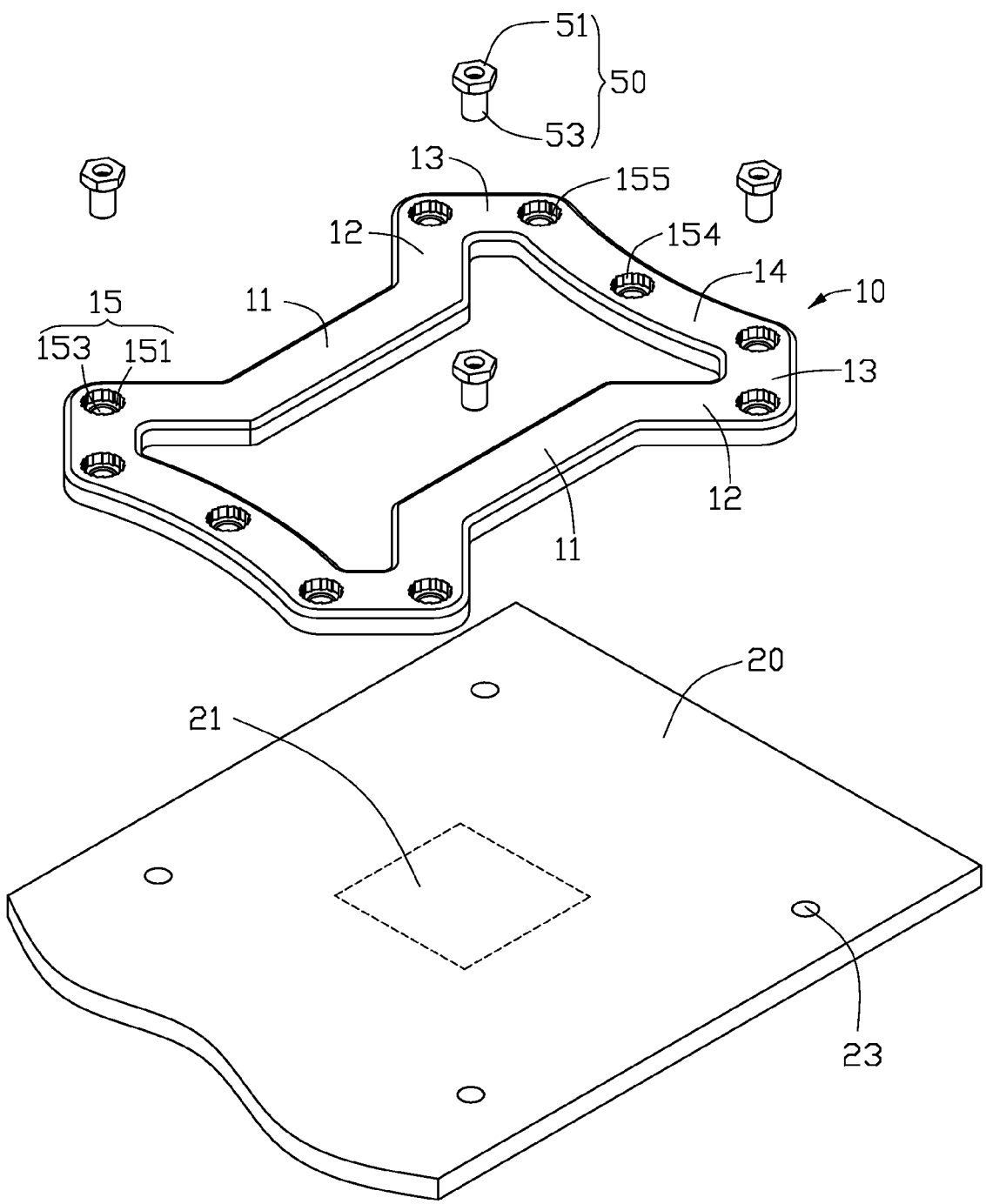
FIG. 2 is an exploded view of the back plate assembly and the mainboard of FIG. 1.
Figure 3:
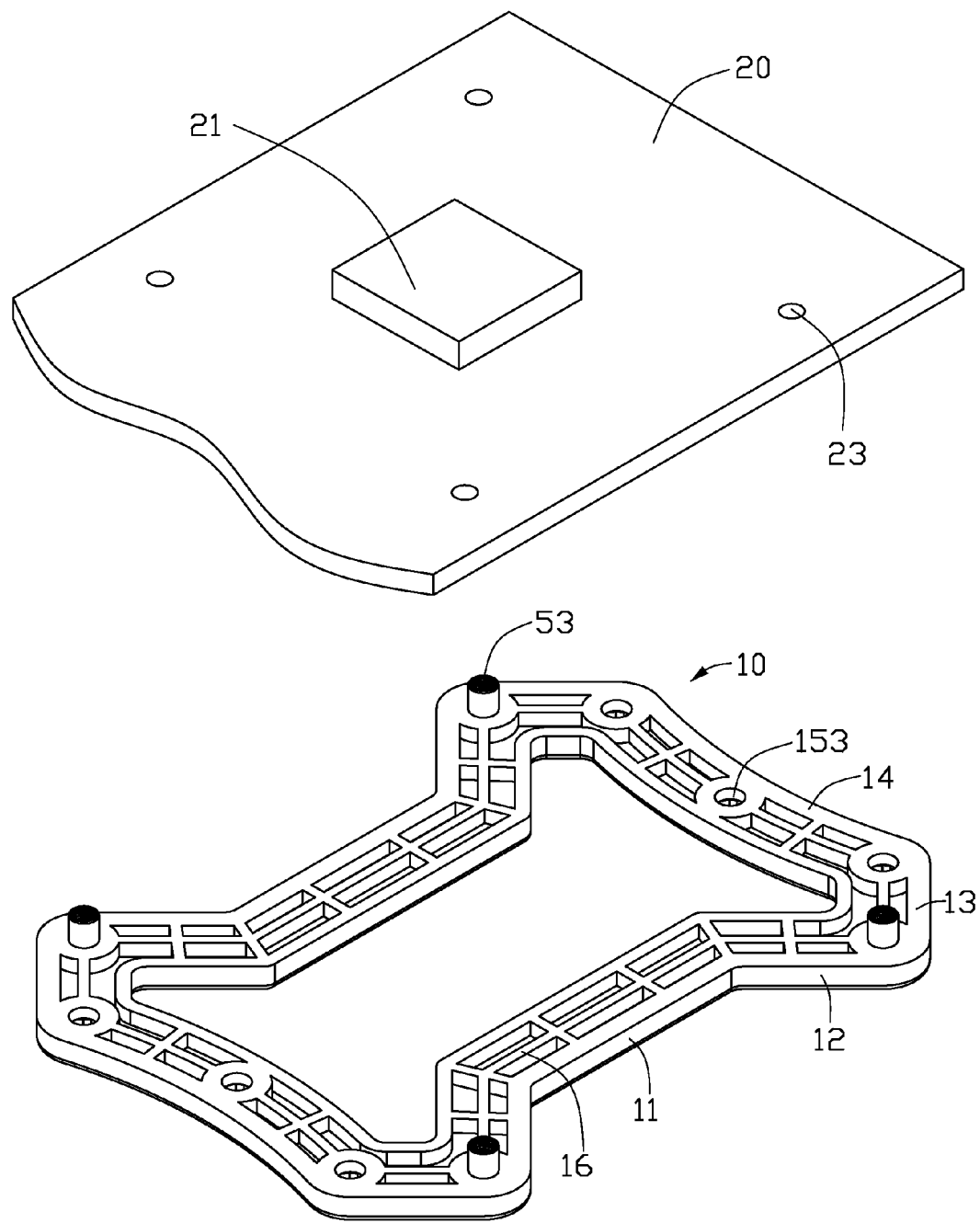
FIG. 3 is an inverted view of FIG. 2.

Referring to FIGS. 1-3, a back plate assembly (not labeled) comprises a back plate 10 and a plurality of fasteners 50 engaging with the back plate 10. The back plate assembly is configured (i.e., structured and arranged) for mounting to a first mainboard 20 (shown in FIG. 2) having a first specification, for example, Intel Socket 775 Motherboard, a second mainboard 30 (shown in FIG. 4) having a second specification, for example, AMD AM2 Socket Motherboard, or a third mainboard 40 (shown in FIG. 5) having a third specification, for example, AMD K8 Socket Motherboard, to engage with a heat sink (not shown) to enable the heat sink to dissipate heat generated from a CPU mounted on the first, second, or third mainboard 20, 30, 40.

Each fastener 50 comprises a baffling portion 51 and a connecting portion 53 extending perpendicularly and downwardly from a central portion of the baffling portion 51. The baffling portion 51 has a hexagonal prism configuration. The connecting portion 53 is a cylindrical, hollow tube. An inner surface of the connecting portion 53 defines threads to cooperate with a bolt (not shown) to assemble a heat sink (not shown) to the first mainboard 20.

The back plate 10 is made of elastic plastic and symmetrical about intercrossed central lines (not shown) thereof, which are longitudinally or transversely extended through a center of the back plate 10. The back plate 10 is an annulus. The back plate 10 comprises a pair of elongated, spaced connecting portions 11, a pair of extending portions 12 extending slantwise and outwardly from opposite ends of each of the connecting portions 11, a linking portion 13 extending slantwise and inwardly from an end of each of the extending portions 12, and a pair of arc-shaped mounting portions 14 connecting with ends of the linking portions 13, respectively. The connecting portions 11 are parallel to each other. A plurality of reinforce ribs 16 is formed on a bottom portion of the back plate 10 to reinforce the back plate 10. A plurality of mounting holes 15 is defined in the back plate 10 to receive the fasteners 50. The mounting holes 15 comprises a first set of mounting holes 15 which are defined in joints of the extending portions 12 and the linking portions 13, a second set of mounting holes 15 which are defined in joints of the linking portions 13 and the mounting portions 14, and a third set of mounting holes 15 which is defined in central portions of each of the mounting portions 14. The fasteners 50 extend through a corresponding set of mounting holes 15 of the back plate 10 and engage with a corresponding mainboard to assemble the back plate 10 on the corresponding mainboard. Each mounting hole 15 is a counterbore and comprises a first receiving hole 151 and second receiving hole 153 located under and in communication with a lower portion of the first receiving hole 151. A baffling plate 155 is located between the first and second receiving holes 151, 153 of the mounting hole 15. The baffling portion 51 and the connecting portion 53 of the fastener 50 engage in the first and second receiving holes 151, 153, respectively. The first receiving hole 151 is enclosed by a plurality of engaging plates 154, which are angled with each other to engage with a periphery of the baffling portion 51. A bore diameter of the first receiving hole 151 is slightly smaller than a diameter of the baffling portion 51 of the fastener 50. A bore diameter of the second receiving hole 153 is slightly smaller than a diameter of the connecting portion 53 of the fastener 50. Thus, the fasteners 50 are forced to be interferentially fitted in the corresponding set of mounting holes 15.

In assembly, the back plate 10 is located at a bottom surface of the first mainboard 20 to have the first set of mounting holes 15 in alignment with through holes 23 of the first mainboard 20. The fasteners 50 extend through the first set of mounting holes 15 of the back plate 10. In this state, the baffling portions 51 of the fasteners 50 are interferentially fitted in the first receiving holes 151 respectively, and the connecting portions 53 of the fasteners 50 are interferentially fitted in the second receiving holes 151 of the first set of mounting holes 15, respectively. The bottom portion of the baffling portion 51 of the fasteners 50 abut against top surfaces of the baffling plates 155, respectively. Bolts (not shown) are used to extend through the heat sink and the holes 23 of the first mainboard 20 to threadedly engage in the connecting portions 53 of the fasteners 50, thereby to secure mount the heat sink to a CPU 21 mounted on the first mainboard 20. Thus, heat generated by the CPU 21 can be effectively dissipated by the heat sink.

Figure 4:
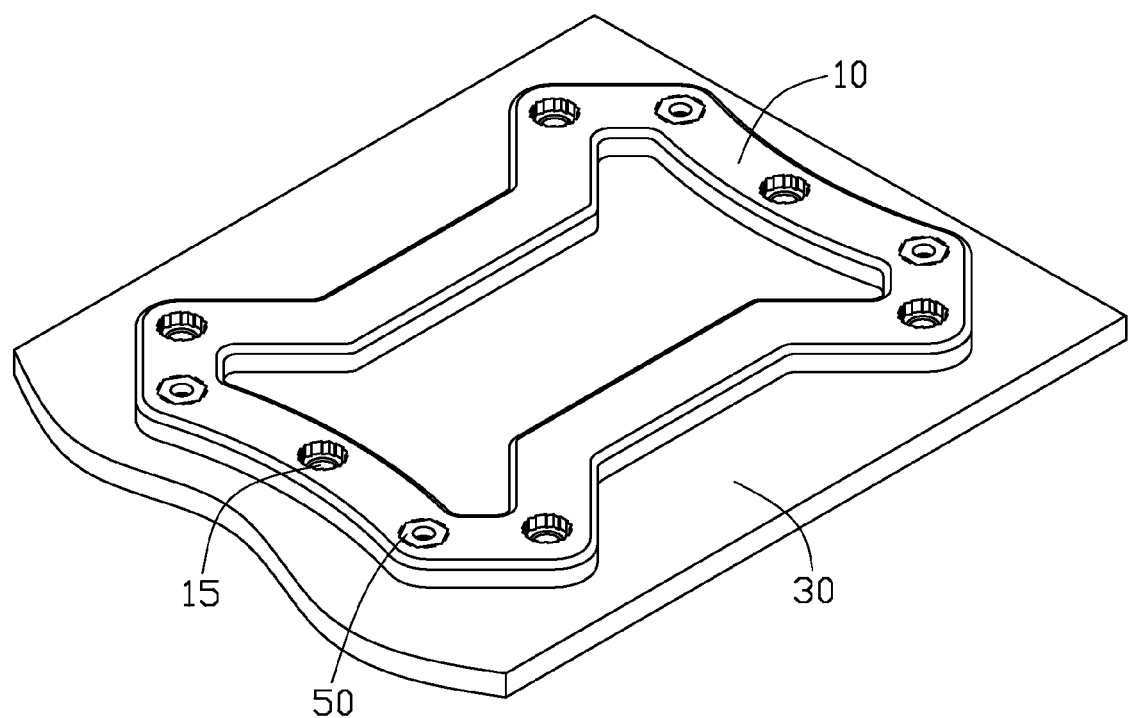
FIG. 4 is an assembled view of the back plate assembly mounted to a mainboard with a second specification.
Figure 5:
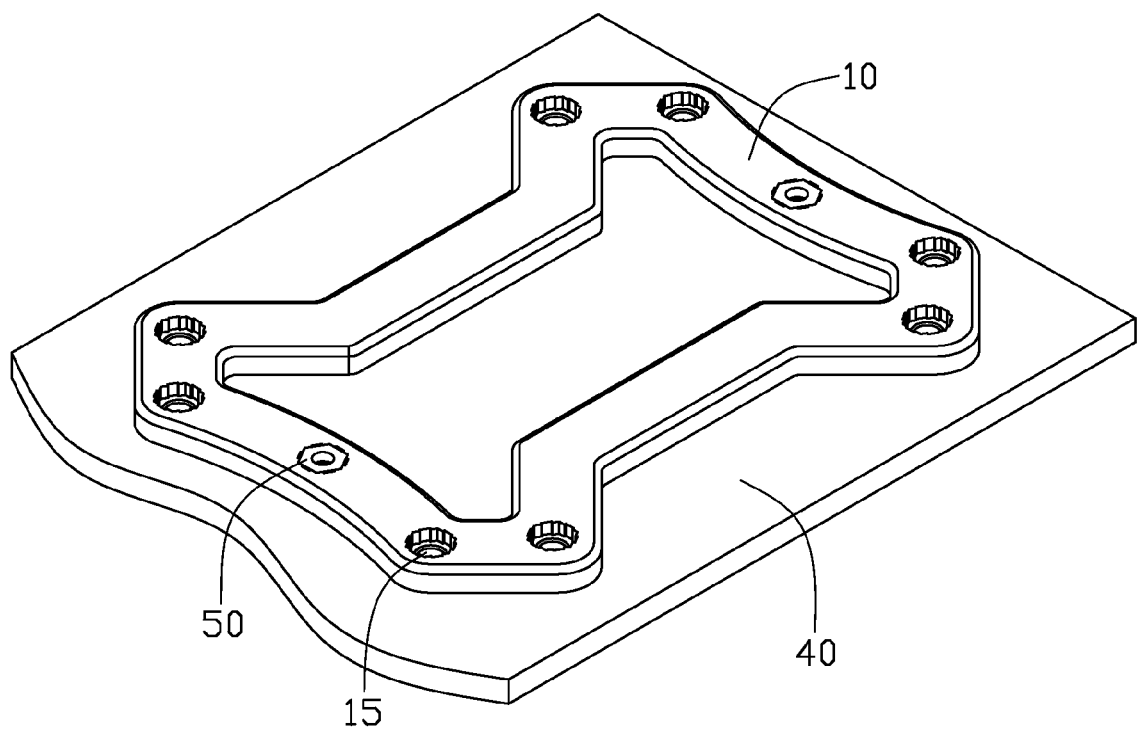
FIG. 5 is an assembled view of the back plate assembly mounted to a mainboard with a third specification.

Referring to FIGS. 4-5, the fasteners 50 extend through the second set of mounting holes 15 (FIG. 4) or the third set of mounting holes 15 (FIG. 5) to mount the back plate 10 on the second mainboard 30 (FIG. 4) or the third mainboard 40 (FIG. 5).

The back plate 10 is compatible with the first, second and third mainboards 20, 30, 40. Thus, the manufacturing and inventory cost for the back plate 10 can be lowered.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A back plate assembly compatible with mainboards having different specifications, the back plate assembly comprising:
    a back plate defining a plurality of sets of mounting holes, each set of mounting holes adapted for cooperating and aligning with through holes in one of the mainboards with a corresponding specification, the mounting holes being spaced from each other, each of the mounting holes comprising a first receiving hole and a second receiving hole located under and in communication with a lower portion of the first receiving hole; and
    a plurality of fasteners interferentially fitted in a corresponding set of the mounting holes of the back plate, each of the fasteners comprising a baffling portion received in the first receiving hole of the each mounting hole, and a connecting portion extending downwardly from the baffling portion and received in the second receiving hole of the each mounting hole;
    wherein the back plate comprises a pair of elongated, spaced connecting portions, a pair of extending portions extending slantwise and outwardly from opposite ends of each of the connecting portions, a linking portion extending slantwise and inwardly from an end of each of the extending portions, and a pair of arc-shaped mounting portions connecting with ends of the linking portions, respectively.

2. The back plate assembly as claimed in claim 1, wherein the baffling portion of the fastener is interferentially fitted in the first receiving hole of the each mounting hole.

3. The back plate assembly as claimed in claim 1, wherein the connecting portion of the fastener is interferentially fitted in the second receiving hole of the each mounting hole.

4. The back plate assembly as claimed in claim 1, wherein a baffling plate is located between the first and second receiving holes and abuts against a bottom of the baffling portion of the each fastener.

5. The back plate assembly as claimed in claim 1, wherein the first receiving hole of the each mounting hole is enclosed by a plurality of engaging plates angled with each other, a periphery of the baffling portion of the fastener intimately engaging with the engaging plates.

6. The back plate assembly as claimed in claim 1, wherein the baffling portion of the each fastener has a hexagonal prism configuration, and the connecting portion of the each fastener is a hollow tube.

7. The back plate assembly as claimed in claim 1, wherein the sets of mounting holes comprises a first set of mounting holes which is defined in joints of the extending portions and the linking portions, a second set of mounting holes which is defined in joints of the linking portions and the mounting portions, and a third set of mounting holes which is defined in central portions of each of the mounting portions, the fasteners extending through the corresponding set of mounting holes to secure the back plate to the one of the mainboards with a corresponding specification.

8. The back plate assembly as claimed in claim 1, wherein the back plate is symmetrical about central lines which are longitudinally or transversely extending through a center of the back plate.

9. The back plate assembly as claimed in claim 1, wherein a plurality of reinforce ribs is formed on a bottom portion of the back plate.

* * * * *